(12) United States Patent
Matsuura

(10) Patent No.: US 9,105,672 B2
(45) Date of Patent: Aug. 11, 2015

(54) HEAT TREATMENT APPARATUS

(75) Inventor: Hiroyuki Matsuura, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 449 days.

(21) Appl. No.: 13/561,373

(22) Filed: Jul. 30, 2012

(65) Prior Publication Data

US 2013/0034820 A1 Feb. 7, 2013

(30) Foreign Application Priority Data

Aug. 4, 2011 (JP) ................................. 2011-171183

(51) Int. Cl.
| | |
|---|---|
| *F27D 3/12* | (2006.01) |
| *H01L 21/67* | (2006.01) |
| *F27B 17/00* | (2006.01) |
| *H01L 21/677* | (2006.01) |

(52) U.S. Cl.
CPC ...... *H01L 21/67109* (2013.01); *F27B 17/0025* (2013.01); *H01L 21/6719* (2013.01); *H01L 21/67757* (2013.01)

(58) Field of Classification Search
CPC ....................... F27B 17/0025; H01L 21/67757
USPC .......... 432/239, 241, 253, 258, 230; 219/390, 219/405, 416
See application file for complete search history.

(56) References Cited

U.S. PATENT DOCUMENTS

| | | | | |
|---|---|---|---|---|
| 4,412,812 A | * | 11/1983 | Sadowski et al. | 432/121 |
| 4,943,234 A | * | 7/1990 | Sohlbrand | 432/152 |
| 5,009,591 A | * | 4/1991 | Watanabe | 432/128 |
| 5,221,201 A | * | 6/1993 | Yamaga et al. | 432/241 |
| 5,226,812 A | * | 7/1993 | Sakata | 432/241 |
| 5,277,579 A | * | 1/1994 | Takanabe | 432/5 |
| 5,407,181 A | * | 4/1995 | Ohsawa | 266/257 |
| 5,407,350 A | * | 4/1995 | Iwabuchi et al. | 432/241 |
| 5,645,419 A | * | 7/1997 | Ohsawa et al. | 432/241 |
| 6,303,908 B1 | * | 10/2001 | Yamaga et al. | 219/411 |
| 8,023,806 B2 | | 9/2011 | Ichikawa et al. | |
| 2005/0023266 A1 | * | 2/2005 | Ueno et al. | 219/390 |
| 2008/0232787 A1 | | 9/2008 | Ichikawa et al. | |

FOREIGN PATENT DOCUMENTS

| | | |
|---|---|---|
| JP | 10-209066 A1 | 8/1998 |
| JP | 2001-284277 A1 | 10/2001 |
| JP | 2008-263170 A1 | 10/2008 |

OTHER PUBLICATIONS

Japanese Office Action (Application No. 2011-171183) dated Oct. 3, 2014.

* cited by examiner

*Primary Examiner* — Gregory A Wilson
(74) *Attorney, Agent, or Firm* — Burr & Brown, PLLC

(57) ABSTRACT

A heat treatment apparatus for performing heat treatment of processing objects at a time without changing the interior configuration of a conventional clean room even when the processing objects are large-sized. The heat treatment apparatus is installed in a clean room. The heat treatment apparatus includes: a heat treatment furnace including a vertical processing chamber having a furnace opening at the top and adapted to house and heat-treat processing objects, a heat insulator that surrounds the circumference of the processing chamber, and a heater provided on the inner peripheral surface of the heat insulator; a lid for closing the furnace opening of the processing chamber; and a holding tool, hung via a heat-retaining cylinder from the lid, for holding the processing objects in multiple stages. The heat treatment furnace of the heat treatment apparatus, for the most part in the height direction, lies beneath the floor of the clean room.

6 Claims, 2 Drawing Sheets

HEAT TREATMENT APPARATUS

CROSS-REFERENCE TO RELATED APPLICATION

This application claims the priority benefit of Japanese Patent Application No. 2011-171183, filed on Aug. 4, 2011, the disclosure of which is incorporated herein by reference in its entirety.

TECHNICAL FIELD

The present invention relates to a heat treatment apparatus including a heat treatment furnace.

BACKGROUND ART

In the manufacturing of a semiconductor device, various types of heat treatment apparatuses are used to perform treatments, such as oxidation, diffusion, CVD (chemical vapor deposition), etc., of a semiconductor wafer as a processing object. A common heat treatment apparatus comprises a heat treatment furnace including a processing chamber having a furnace opening at the bottom and adapted to house and heat-treat semiconductor wafers, a heat insulator disposed such that it surrounds the circumference of the processing chamber, and a heater, provided on the inner peripheral surface of the heat insulator, for heating the wafers in the processing chamber; a lid for closing the furnace opening of the processing chamber; a holding tool, mounted on the lid, for holding the wafers in multiple stages; and a lifting mechanism for raising and lowering the lid. Such a common heat treatment apparatus generally has a vertical structure, extending vertically as a whole, and is installed in a clean room.

These days such a heat treatment apparatus is required to heat-treat large semiconductor wafers having a diameter of 450 mm. When heat-treating 450-mm semiconductor wafers, the wafers need to be arranged at a considerably larger pitch in a heat treatment furnace. Thus, in order to process a certain number of larger wafers at a time, it is necessary to use a heat treatment furnace having a considerably larger overall height. However, because of the restriction of the interior height of a clean room, it may not practically be possible to increase the height of a conventional vertical heat treatment furnace to such an extent.

PRIOR ART DOCUMENT

Patent document 1: Japanese Patent Laid-Open Publication No. 2008-263170

SUMMARY OF THE INVENTION

The present invention has been made in view of the above situation. It is therefore an object of the present invention to provide a heat treatment apparatus which can perform heat treatment of a certain number of processing objects at a time without changing the interior configuration of a conventional clean room even when the processing objects are large-sized ones.

In order to achieve the object, the present invention provides a heat treatment apparatus, installed in a clean room having a floor, comprising: a heat treatment furnace including a vertical processing chamber having a furnace opening at the top and adapted to house and heat-treat a plurality of processing objects, a heat insulator that surrounds the circumference of the processing chamber, and a heater provided on the inner peripheral surface of the heat insulator; a lid for closing the furnace opening of the processing chamber; a holding tool, hung from the lid, for holding the plurality of processing objects in multiple stages; and a lifting mechanism for raising and lowering the lid to open and close the furnace opening by the lid and to carry the holding tool out of and into the processing chamber, wherein the heat treatment furnace is installed beneath the floor of the clean room, and the lifting mechanism is installed above the floor of the clean room.

In a preferred embodiment of the present invention, a portion of the heat treatment furnace, corresponding to at least 30% of the length of the heat treatment furnace in the height direction, lies beneath the floor of the clean room.

In a preferred embodiment of the present invention, the processing chamber has at the top a manifold flange defining the furnace opening and to which a gas supply line is connected.

Preferably, the manifold flange of the processing chamber lies above the floor of the clean room.

Preferably, a first exhaust line is connected to the manifold flange of the processing chamber.

In a preferred embodiment of the present invention, the lifting mechanism is housed in a casing provided above the floor of the clean room.

In a preferred embodiment of the present invention, the outer circumference of the heat treatment furnace is covered with a heater cover.

Preferably, a second exhaust line is connected to the heater cover.

According to the present invention, the heat treatment furnace is installed beneath the floor of a clean room. This makes it possible to perform heat treatment of a certain number of processing objects without significantly changing the interior configuration of a conventional clean room even when the heat treatment furnace has a large overall height in order to process large-sized processing objects which need to be arranged at a large pitch at the time of processing.

DETAILED DESCRIPTION OF THE INVENTION

Preferred embodiments of the present invention will now be described with reference to the drawings.

Figure 1:
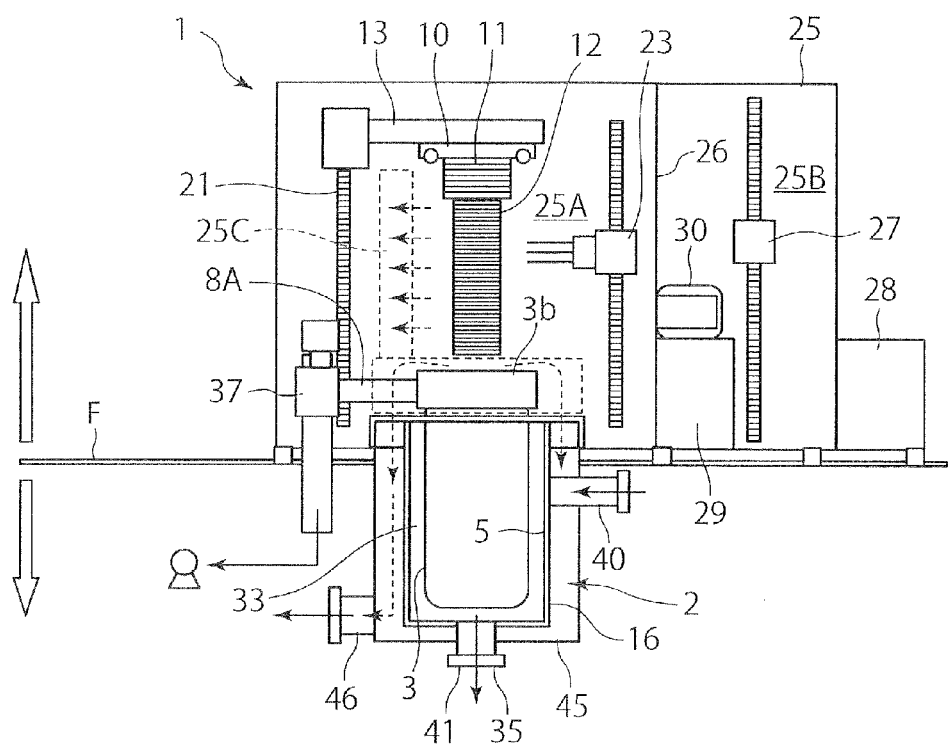
FIG. 1 is a vertical sectional view schematically showing a heat treatment apparatus according to an embodiment of the present invention.
Figure 2:
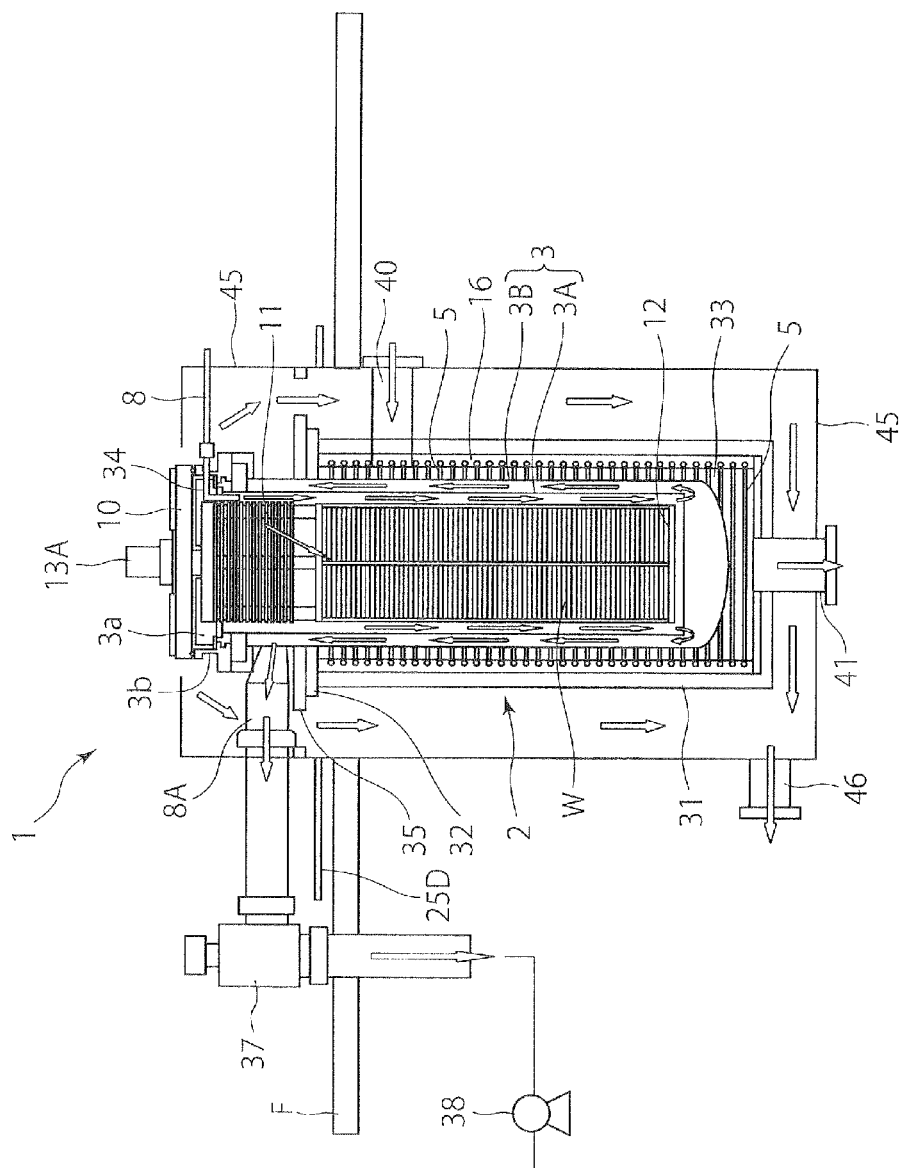
FIG. 2 is an enlarged detailed view of the heat treatment furnace of the heat treatment apparatus.

In FIGS. 1 and 2, reference numeral 1 denotes a heat treatment apparatus (vertical heat treatment apparatus). The heat treatment apparatus 1 can house a large number of processing objects, e.g. semiconductor wafers W, and perform heat treatment such as oxidation, diffusion, low-pressure CVD, etc. The heat treatment apparatus 1 as a whole is installed in a clean room 1A having a floor F. The heat treatment apparatus 1 comprises a heat treatment furnace 2 including a vertical cylindrical processing chamber 3 having a furnace opening 3a at the top, a cylindrical heat insulator 16 disposed such that it surrounds the circumference of the processing chamber 3, and a heater 5, provided on the inner peripheral surface of the heat insulator 16, for heating the wafers W; a lid 10 for closing the furnace opening 3a of the processing chamber 3; and a boat (holding tool) 12, hung via a heat-retaining cylinder 11 from the lid 10, for holding the semiconductor wafers W in multiple stages.

The processing chamber 3 includes an inner quartz tube 3A and an outer quartz tube 3B, and a manifold flange 3b is mounted at the top and defining the furnace opening 3a.

To the manifold flange 3b are connected a gas supply line 8 for supplying e.g. a processing gas and an inert gas, and a first exhaust line 8A. A gas injector 34 is provided at the front end of the gas supply line 8. The first exhaust line 8A is connected via a stopper valve 37 to a vacuum pump 38 for vacuuming of the processing chamber 3.

The outer circumference of the heat insulator 16 is held by a holder 31 whose top is secured to a fixed flange 32. The fixed flange 32 and the holder 31 are fixed via a support structure 35 to the floor F of the clean room 1A.

The outer circumference of the holder 31 holding the heat insulator 16 is covered with a heater cover 45 to which is connected a second exhaust line 46.

The second exhaust line 46 exhausts a heated gas from the interior of the heater cover 45 so as to cool the interior of the heater cover 45, and also discharges a slight amount of a processing gas, leaking from the gas supply line 8, from the interior of the heater cover 45 to the outside.

The heater cover 45, besides externally covering the holder 31 holding the heat insulator 16, also externally covers the manifold flange 3b provided at the top of the processing chamber 3. Therefore, it is possible that a slight amount of a processing gas can leak from the gas supply line 8, connected to the manifold flange 3b, into the interior of the heater cover 45.

In that case, the processing gas, together with a heated gas in the interior of the heater cover 45, can be discharged to the outside through the second exhaust line 46 connected to the heater cover 45 and having a not-shown vacuum pump.

The heat treatment furnace 2 of the above-described heat treatment apparatus 1, including the processing chamber 3 includes the inner tube 3A and the outer tube 3B, the heat insulator 16 and the heater 5, for the most part in the height direction, is installed beneath the floor F of the clean room 1A. A lifting mechanism 13 for raising and lowering the lid 10 is located above the floor F of the clean room 1A, as will be described later.

In particular, a major portion of the heat treatment furnace 2, e.g. corresponding to 30% to 100%, preferably 40% to 100% of the length in the height direction, lies beneath the floor F of the clean room 1A. The manifold flange 3b at the top of the processing chamber 3 lies above the floor F of the clean room 1A.

As described above, the manifold flange 3b of the processing chamber 3 is provided with the gas supply line 8 for introducing e.g. a processing gas and an inert gas into the processing chamber 3, and the first exhaust line 8A for exhausting a gas from the processing chamber 3. The gas supply line 8 is connected to a not-shown gas supply source, while the first exhaust line 8A is connected via the stopper valve 37 to the vacuum pump 38 capable of controllably depressurizing the processing chamber 3 e.g. to about 10 to $10^{-8}$ Torr.

As described above, the processing chamber 3 has, at the top, the furnace opening 3a which is to be closed by the lid 10. The lid 10 is vertically movable by means of the lifting mechanism 13.

As described above, the heat-retaining cylinder 11 as a heat-retaining means is provided under the lid 10, and the quartz boat 12 as a holding tool for holding a large number, e.g. about 100 to 150, of wafers W e.g. having a diameter of 450 mm at a predetermined spacing in the vertical direction, is hung from the heat-retaining cylinder 11. The lid 10 is provided with a rotating mechanism 13A for rotating the boat 12 on its axis. The boat 12 is carried (unloaded) from the processing chamber 3 upward into a loading area 25A by the upward movement of the lid 10 driven by the lifting mechanism 13 and, after replacement of wafers W, carried (loaded) from the loading area 25A into the processing chamber 3 by the downward movement of the lid 10 driven by the lifting mechanism 13.

As shown in FIG. 1, the lifting mechanism 13 is disposed above the floor F of the clean room 1A and is housed in a casing 25 provided above the floor F. The interior of the casing 25 is divided by a compartment wall 26 into the loading area 25A and a wafer transfer area 25B. A gas is continually exhausted from the loading area 25A by means of an exhaust system 25C.

A loading port 28 is provided outside the wafer transfer area 25B of the casing 25. A wafer carrier 30 is placed on the loading port 28. The wafer carrier 30 on the loading port 28 is carried into the wafer transfer area 25B, and is transported by a carrier transporter 27 to a transfer stage 29. Wafers W are then transferred by a wafer transporter 23 from the wafer carrier 30 on the transfer stage 29 into the loading area 25A, and the wafers W are inserted into the boat 12 by the wafer transporter 23. Referring to FIG. 2, the floor 25D of the casing 25 is located immediately above the floor F of the clean room 1A.

The construction of the heat treatment furnace 2 will now be described further with reference to FIG. 2, starting with a description of the heat insulator 16 of the heat treatment furnace 2 and the heater 5 provided on the inner peripheral surface of the heat insulator 16. Groove-like shelf portions, arranged in multiple stages in the axial direction (vertical direction in FIG. 2), are formed in the inner peripheral surface of the heat insulator 16. Heater elements, constituting the heater 5, are disposed along the shelf portions. The heat insulator 16 is composed of inorganic fibers, such as silica, alumina or alumina silicate. The heat insulator 16 is longitudinally halved to facilitate assembly of the heater elements.

Each heater element has a corrugated shape obtained by shaping (bending) of a strip-shaped heat generating resistor. The corrugated heater element is composed of, for example, an alloy (Kanthal alloy) consisting of iron (Fe), chromium (Cr) and aluminum (Al). The heater element has, for example, a thickness of about 1 to 2 mm, a width of about 14 to 18 mm, a corrugation amplitude of about 11 to 15 mm and a corrugation pitch P of about 28 to 32 mm. The apex angle $\theta$ of each apex portion (top portion or peak portion) of the corrugated heater element is made about 90 degrees and the apex portions have been subjected to R-bending.

In order to rapidly lower the temperatures of wafers after heat treatment so as to speed up the process and increase the throughput, the heat treatment furnace 2 is provided with a forced cooling line 40 for introducing a cooling medium into the space 33 between the heat insulator 16/the holder 31 and the processing chamber 3 to forcibly cool the space 33. The forced cooling line 40 penetrates through the heater cover 45, the holder 31 and the heat insulator 16. The holder 31 is provided at the bottom with a third exhaust line 41 for evacuating the space 33 between the holder 31 and the processing chamber 3. The third exhaust line 41 penetrates through the heater cover 45 and the holder 31.

Air, nitrogen gas, water, or the like may be used as the cooling medium to be supplied from the forced cooling line 40.

The operation of the thus-constructed heat treatment apparatus of this embodiment will now be described.

First, a wafer carrier 30 is transported by the carrier transporter 27 onto the transfer stage 29 in the wafer transfer area 25B, and wafers W are carried from the wafer carrier 30 into the loading area 25A. Next, in the loading area 25, the wafers W are transported by the wafer transporter 23 into the boat 12. The boat 12 has been hung via the heat-retaining cylinder 11 from the lid 10.

Next, the lid 10, holding the boat 12 via the heat-retaining cylinder 11, moves downward by means of the lifting mechanism 13, which moves up and down by means of a screw mechanism 21, whereby the heat-retaining cylinder 11 and the boat 12 are inserted into the processing chamber 3. The furnace opening 3a of the processing chamber 3 is then closed by the lid 10.

Next, the internal temperature of the processing chamber 3 is raised and the processing chamber 3 is kept at a high temperature for processing of the wafers W. After the processing, the internal temperature of the processing chamber 3 is lowered. During the above operation, a cooling medium is introduced from the forced cooling line 40 into the space 33 while the space 33 is evacuated by the third exhaust line 41. This, together with the heater 5, controls the internal temperature of the processing chamber 3.

A processing gas(es) is supplied into the processing chamber 3 in the following manner:

While controlling the internal temperature of the processing chamber 3, a processing gas is supplied from the gas supply line 8 into the processing chamber 3 to perform an intended heat treatment of the wafers W. During the heat treatment, the boat 12 is rotated in the processing chamber 3 by means of the rotating mechanism 13A provided in the lid 10.

Next, the gas in the processing chamber 3 is exhausted from the first exhaust line 8A and the processing chamber 3 is depressurized to vacuum.

After thus performing the intended heat treatment of the wafers W, the wafers W may be subjected to further heat treatment with a different gas.

Thus, the above-described temperature control of the processing chamber 3 is repeated, and the different processing gas is supplied into the processing chamber 3 to perform further heat treatment of the wafers W.

Upon the completion of heat treatment of the wafers W, the lid 10 moves upward by means of the lifting mechanism 13 which moves up and down by means of the screw mechanism 21, thereby moving the boat 12, hung via the heat-retaining cylinder 11 from the lid 10, to the loading area 25A.

As described previously, the heat treatment furnace 2, for the most part in the height direction, is disposed beneath the floor F of the clean room 1A. Thus, even when the heat treatment furnace 2 is designed to have a large overall height in order to process large wafers W, e.g. having a diameter of 450 mm, the heat treatment furnace 2 will not project considerably from the floor F. There is, therefore, no need to change the interior configuration of the conventional clean room 1A, nor any need to reduce the number of such large wafers W to be heat-treated at a time due to the restriction of the height of a heat treatment furnace from the floor F.

What is claimed is:

1. A heat treatment apparatus, installed in a clean room having a floor, comprising:
    a heat treatment furnace including a vertical processing chamber having a furnace opening at the top and adapted to house and heat-treat a plurality of processing objects, a heat insulator that surrounds the circumference of the processing chamber, and a heater provided on the inner peripheral surface of the heat insulator;
    a lid for closing the furnace opening of the processing chamber;
    a holding tool, hung from the lid, for holding the plurality of processing objects in multiple stages; and
    a lifting mechanism for raising and lowering the lid to open and close the furnace opening by the lid and to carry the holding tool out of and into the processing chamber, wherein the heat treatment furnace is installed beneath the floor of the clean room, and the lifting mechanism is installed above the floor of the clean room,
    wherein the outer circumference of the heat treatment furnace is covered with a heater cover, and
    a second exhaust line is connected to the heater cover.

2. The heat treatment apparatus according to claim 1, wherein a portion of the heat treatment furnace, corresponding to at least 30% of the length of the heat treatment furnace in the height direction, lies beneath the floor of the clean room.

3. The heat treatment apparatus according to claim 1, wherein the processing chamber has at the top a manifold flange defining the furnace opening and to which a gas supply line is connected.

4. The heat treatment apparatus according to claim 3, wherein the manifold flange of the processing chamber lies above the floor of the clean room.

5. The heat treatment apparatus according to claim 3, wherein a first exhaust line is connected to the manifold flange of the processing chamber.

6. The heat treatment apparatus according to claim 1, wherein the lifting mechanism is housed in a casing provided above the floor of the clean room.

* * * * *